(12) United States Patent
Kang

(10) Patent No.: US 8,218,384 B2
(45) Date of Patent: Jul. 10, 2012

(54) SENSE AMPLIFIER FOR CONTROLLING FLIP ERROR AND DRIVING METHOD THEREOF

(75) Inventor: Hee Bok Kang, Chungcheongbuk-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 13/096,352

(22) Filed: Apr. 28, 2011

(65) Prior Publication Data

US 2011/0199849 A1     Aug. 18, 2011

Related U.S. Application Data

(62) Division of application No. 12/046,595, filed on Mar. 12, 2008, now Pat. No. 7,952,947.

(30) Foreign Application Priority Data

Dec. 5, 2007     (KR) .......................... 10-2007-0125388

(51) Int. Cl.
*G11C 7/00*     (2006.01)
(52) U.S. Cl. ...................................... 365/205; 365/203
(58) Field of Classification Search .................. 365/205, 365/203, 189.15, 189.16, 190, 207
See application file for complete search history.

(56) References Cited

U.S. PATENT DOCUMENTS 4,777,625 A * 10/1988 Sakui et al. .................. 365/207
6,301,173 B2   10/2001 Fujioka et al.

FOREIGN PATENT DOCUMENTS

| JP | 5074175 A | 3/1993 |
|----|-----------|--------|
| JP | 2002-150777 A | 5/2002 |
| KR | 1999-003109 A | 1/1999 |
| KR | 2004-0022674 A | 3/2004 |

OTHER PUBLICATIONS

USPTO OA mailed May 25, 2010 in connection with U.S. Appl. No. 12/046,595.
USPTO OA mailed Aug. 31, 2010 in connection with U.S. Appl. No. 12/046,595.
USPTO NOA mailed Jan. 25, 2011 in connection with U.S. Appl. No. 12/046,595.

* cited by examiner

*Primary Examiner* — Tuan T Nguyen
*Assistant Examiner* — Lance Reidlinger
(74) *Attorney, Agent, or Firm* — Ladas & Parry LLP

(57) ABSTRACT

A sense amplifier and a driving method is described for resolving a flip failure occurrence where the voltage applied across the bit line is within an acceptable threshold range when the data is delivered to the data bus. The driving method includes disconnecting a bit line from a sense amplifying circuit according to a bit line select control signal after performing a read operation according to a read request. Then, connecting the sense amplifying circuit to a data bus according to a column select control signal after the bit line is disconnected from the sense amplifying circuit and deactivating an output terminal of the sense amplifier circuit that is disconnected from the bit line and connected to the data bus during a restore section synchronized to a command following the read command. Finally, delivering the data on the bit line to the output terminal of the sense amplifying circuit to update the output terminal of the sense amplifying circuit by connecting the sense amplifying circuit to the bit line according to the bit line select control signal.

3 Claims, 7 Drawing Sheets

US 8,218,384 B2

SENSE AMPLIFIER FOR CONTROLLING FLIP ERROR AND DRIVING METHOD THEREOF

CROSS-REFERENCE TO RELATED APPLICATIONS

The present application claims priority to Korean patent application number 10-2007-0125388 filed on Dec. 5, 2007, which is incorporated herein by reference in its entirety.

BACKGROUND OF THE INVENTION

The present invention relates to a semiconductor memory device, and more precisely to a sense amplifier that improves a flip failure occurrence if a voltage applied across a bit line is within an acceptable threshold range when the data is delivered to the data bus and a driving method thereof.

The data stored or to be stored in a cell array is carried on the bit line of the semiconductor memory device. The data delivered between the bit line and the data bus is sensed and amplified by the sense amplifier.

Semiconductor memory devices are becoming smaller as they become more highly integrated. As a result, the layout area of the sense amplifier used in a semiconductor memory device tends to be reduced.

By reducing the layout area of the sense amplifier, the current driving capability of an NMOS transistor and a PMOS transistor that constitute the sense amplifier is reduced.

The voltage of a low data output terminal of the sense amplifier is boosted and the voltage of a high data output terminal of the sense amplifier is dropped by a precharge voltage on the data bus if the data amplified in both output terminals of the sense amplifier is delivered to the data bus by driving the column select signal, which is a signal selecting a column of the bit line.

At this time, a flip failure occurs where the data is inverted and amplified by a voltage offset from the threshold voltage of the PMOS transistor if the high data voltage and the low data voltage from the sense amplifier are within an acceptable threshold range.

That is, the flip failure of the bit line, such as in FIG. 1, can occur in the sense amplifier that has a smaller size FIG. 1 is a drawing illustrating that a flipping error occurs so that the bit line /BL is amplified to a core voltage VCORE and the bit line BL is amplified to a ground voltage VSS if the voltage at both output terminals of the sense amplifier is within an acceptable threshold range when a column select signal YI is enabled, a pull-down driving signal SAN is enabled, and a pull-up driving signal SAP are enabled.

SUMMARY OF THE INVENTION

The present invention provides a sense amplifier that can resolve a flip failure caused due to a lower driving capability.

A sense amplifier according to the present invention comprises a sense amplifying circuit connected to a bit line to sense and amplify data carried on the bit line; a bit line select unit selectively connecting between the bit line and the sense amplifying circuit by a bit line select signal; a column select unit selectively connecting between the sense amplifying circuit and the data bus by a column select signal; and a precharge unit precharging a voltage on the bit line between the sense amplifying circuit and the bit line select unit in response to a precharge command, wherein an output terminal of the sense amplifier connected to the bit line is controllably set in an inactivated state during a restore section synchronized to a subsequent command after a read command in a state that the bit line and the sense amplifying circuit are disconnected by the bit line select unit and the sense amplifying circuit and the data bus are connected by the column select unit.

Preferably, the subsequent command after the read command is a write command or a precharge command.

A driving method of the sense amplifier according to the present invention comprising steps of disconnecting a bit line from a sense amplifying circuit by a bit line select signal after a read operation according to a read command; connecting the sense amplifying circuit to a data bus by a column select signal after the bit line is disconnected from the sense amplifying circuit; inactivating an output terminal of the sense amplifier circuit from which the bit line is disconnected and to which the data bus is connected during a restore section synchronized to a subsequent command after the read command; and delivering the data on the bit line to the output terminal of the sense amplifying circuit to update the output terminal of the sense amplifying circuit by causing the sense amplifying circuit having the output terminal inactivated to be connected to the bit line by the bit line select signal.

Preferably, the subsequent command after the read command is a write command or a precharge command.

According to the present invention, it is possible to restore the data inverted by a flip failure caused due to a lower driving capability of the NMOS transistor and the PMOS transistor constituting the sense amplifier, as the layout size of the sense amplifier is reduced.

As a result, the flip failure of the bit line can be resolved.

DESCRIPTION OF SPECIFIC EMBODIMENTS

Hereinafter, preferred embodiments of the present invention will be described in detail with reference to the accompanying drawings.

Figure 1:
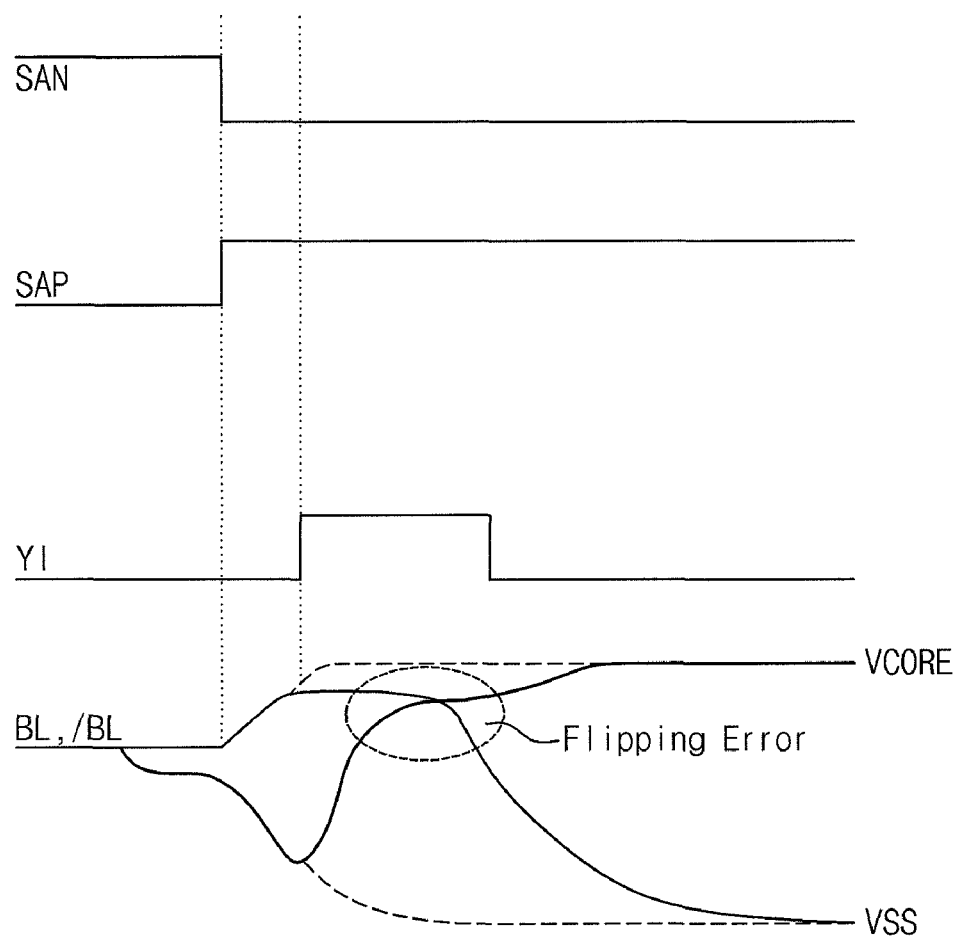
FIG. 1 is a waveform diagram showing a flip failure occurring in a sense amplifier according to a related art.
Figure 2:
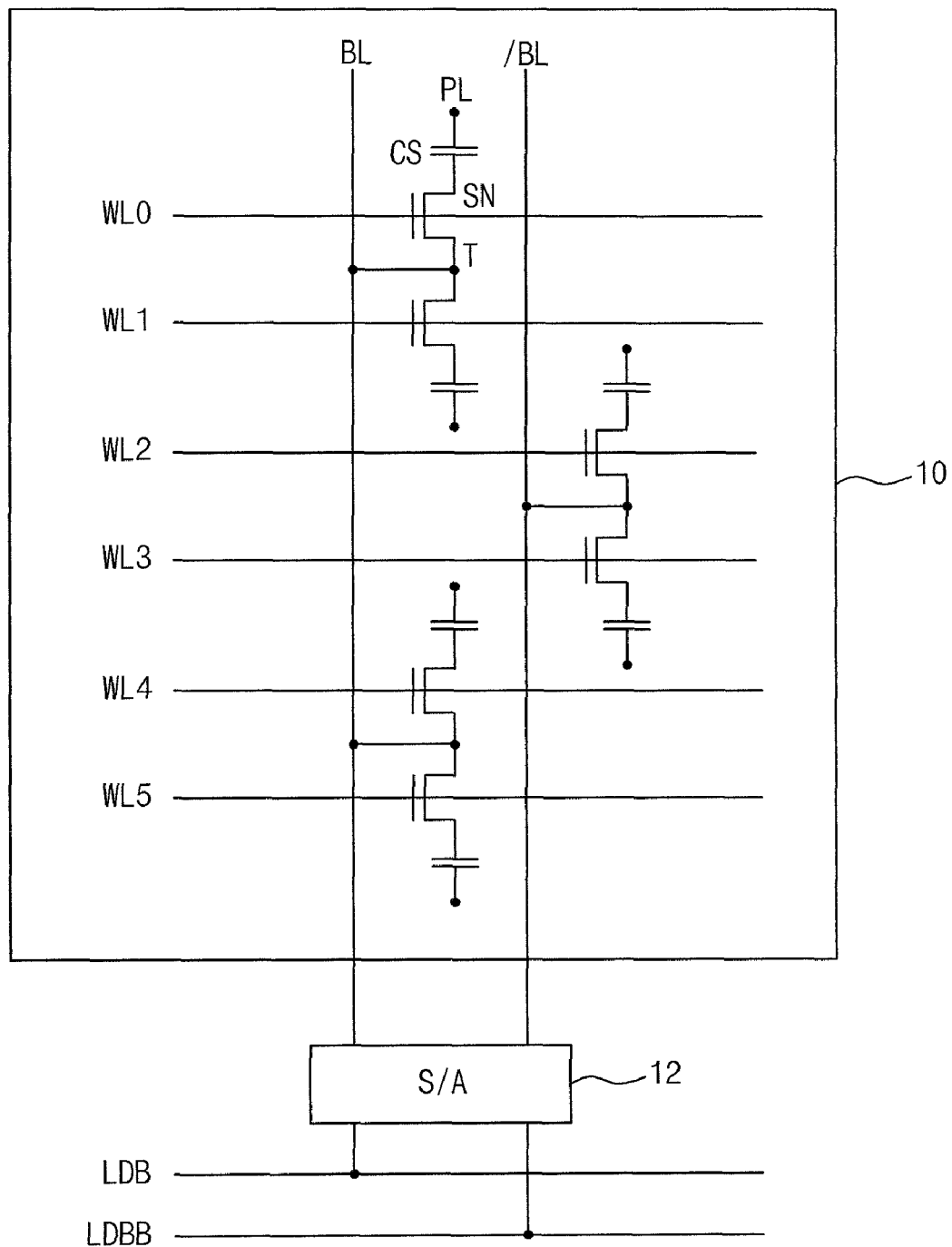
FIG. 2 is a diagram showing a cell array and a sensing related block according to the present invention.

The present invention can be applied to a sense amplifier structured as in FIG. 2, wherein FIG. 2 is a diagram showing a cell array 10 and a sensing related block. To aid in explanation, the present invention exemplifies a cell array 10 having a folded bit line structure and a latch-type sense amplifier 12.

DRAM cells included in the cell array 10 are composed of one NMOS transistor T and one capacitor Cs adjusted by a word line WL (corresponding to each of word lines WL0, WL1, WL2, WL3, WL4 and WL5).

The drain of the NMOS transistor T is connected to the bit line BL and the source is connected to one electrode of the capacitor Cs. A node connected between the NMOS transistor T and the capacitor Cs is defined as a storage node SN. The charge written into the cell as the data is stored on the storage node SN. The other node of the capacitor Cs functions as a plate electrode and is connected to the cell plate PL in common with other cells. A cell plate voltage is applied to the cell plate PL. The cell plate voltage is defined as ½ of the power supply voltage VDD where the power supply voltage VDD is defined as a high operation voltage of the cell. A back bias negative voltage VBB is applied as the PMOS well voltage of the cell array 10.

The latch-type sense amplifier 12 has both output terminals connected to the bit lines BL, /BL. If the word line WL0 is activated causing the cell data to be delivered to the bit line BL, a reference voltage is supplied to the bit line /BL. In contrast, if the word line WL2 is activated causing the cell data to be delivered to the bit line /BL, the reference voltage is supplied to the bit line BL. As a result, the sense amplifier 12 performs a data delivery between the bit lines BL, /BL and the data buses LDB, LDBB.

Figure 3:
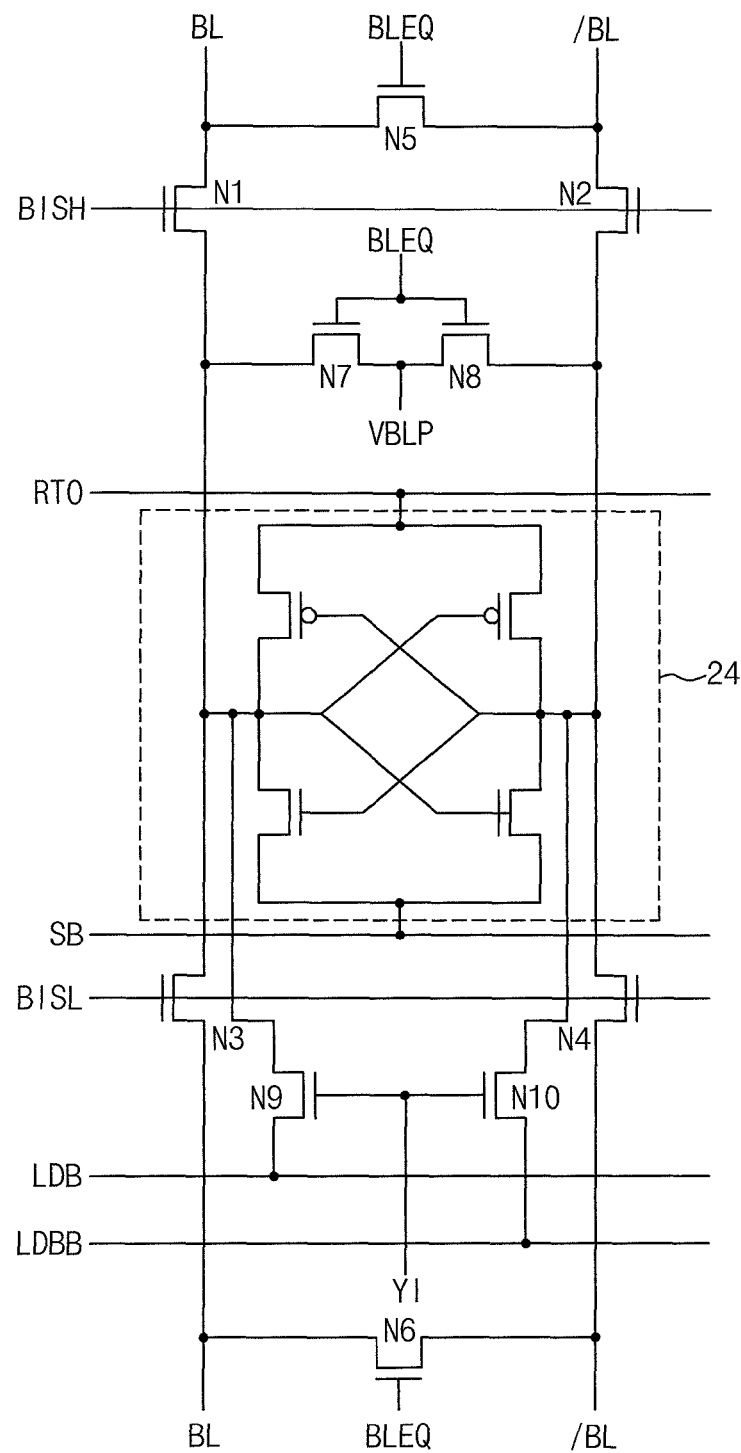
FIG. 3 is a detailed circuit diagram showing the sense amplifier of FIG. 2.

FIG. 3 shows the sense amplifier 12 including a sense amplifying circuit 24 according to the present invention.

The sense amplifier 12 is arranged in such a way that a pull-up driving voltage and a pull-down driving voltage are supplied to the sense amplifying circuit 24, in which the pull-up driving voltage is applied to a pull-up activating terminal RTO and the pull-down driving voltage is applied to a pull-down activating terminal SB.

Bit line select transistors N1, N2 N3 and N4 are provided on the bit lines BL, /BL to selectively connect the sense amplifying circuit 24 with an upper or lower part of the cell array via the bit line select signals BISH, BISL.

Further, equalizing transistors N5, N6 are provided outside the bit line select transistors N1, N2, N3 and N4 to equalize the bit lines BL, /BL by a bit line equalizing signal BLEQ.

A sense amplifying circuit 24 is provided between the bit line select transistors N1, N2 and N3, N4.

Precharge transistors N7, N8 are connected in series with each other between the sense amplifying circuit 24 and the bit line select transistors N1, N2. The half core voltage VBLP is applied to a node between the precharge transistors N7, N8 connected in series. The bit line equalizing signal BLEQ is applied to a gate of each precharge transistor N7 and N8.

As seen in FIG. 3, the output terminals of the sense amplifying circuit 24 are controllably connected to the data buses LDB, LDBB by the column select transistors N9, N10. The column select transistors N9, N10 are controlled by the column select signal YI applied to each gate of the column select transistors N9, N10.

As mentioned above, the half-core voltage VBLP is supplied using the bit line equalizing signal BLEQ in order to precharge the bit lines BL, /BL. The half-core voltage VBLP is defined as ½ of the core voltage VCORE.

The data input/output between the sense amplifying circuit 24 and the data buses LDB, LDBB is performed by the column select signal YI. The data exchange between the sense amplifying circuit 24 and the bit lines BL, /BL is performed by the bit line select signals BISH, BISL.

The sense amplifier structure described above operates as shown in FIG. 4.

Figure 4:
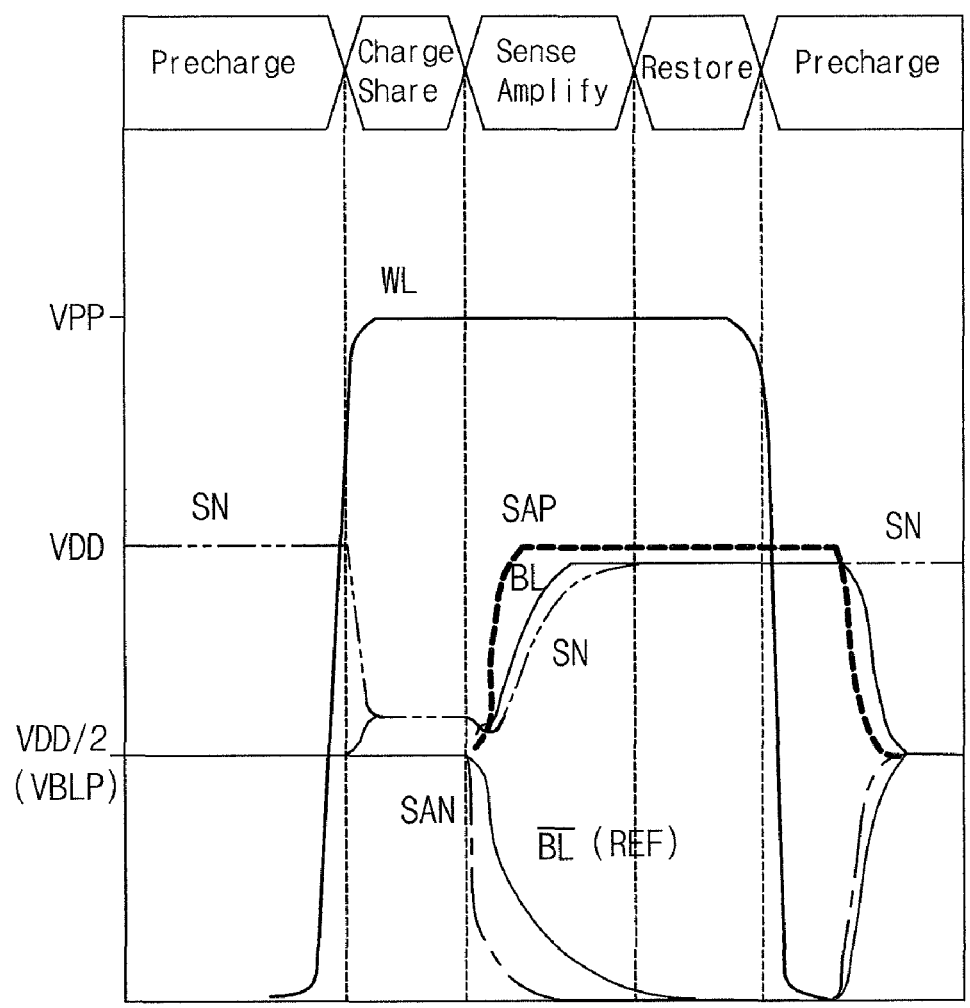
FIG. 4 is an operational timing diagram illustrating the sense amplifier of FIG. 2.

Referring to the operational timing diagram of FIG. 4, in a precharge section, the bit lines BL, /BL, the pull-up activating terminal, and the pull-down activating terminal of the sense amplifier have the bit line precharge voltage VBLP. The bit line precharge voltage VBLP is defined as ½ of the power supply voltage VDD that is a high voltage of the cell.

In a charge share section, the word line WL is activated with the high voltage VPP so that the data of the cell is carried on the bit line BL.

In a sense amplifying section, in order to amplify the signal on the bit lines BL, /BL, the pull-down activating terminal SB transitions to the ground voltage and the pull-up activating terminal RTO transitions to the power supply voltage. Therefore, the bit lines BL, /BL are amplified to the power supply voltage VDD and the ground voltage, respectively.

Thereafter, in a restore section, the amplified signals on the bit lines BL, /BL are rewritten in the cell. If restoring the data is completed, the sense amplifying circuit 24 is returned to the precharge state.

The symbol SN represents a storage node voltage and a REF represents a reference voltage applied to the bit line /BL if the data is carried on the bit line BL.

The sense amplifier, operating as mentioned above, has the restore section in case the flipping error occurs in order to resolve the flipping error.

The sense amplifier will be described regarding cases where a precharge command follows a read command in reference to FIG. 5 and where a write command follows a read command in reference to FIG. 6.

Figure 5:
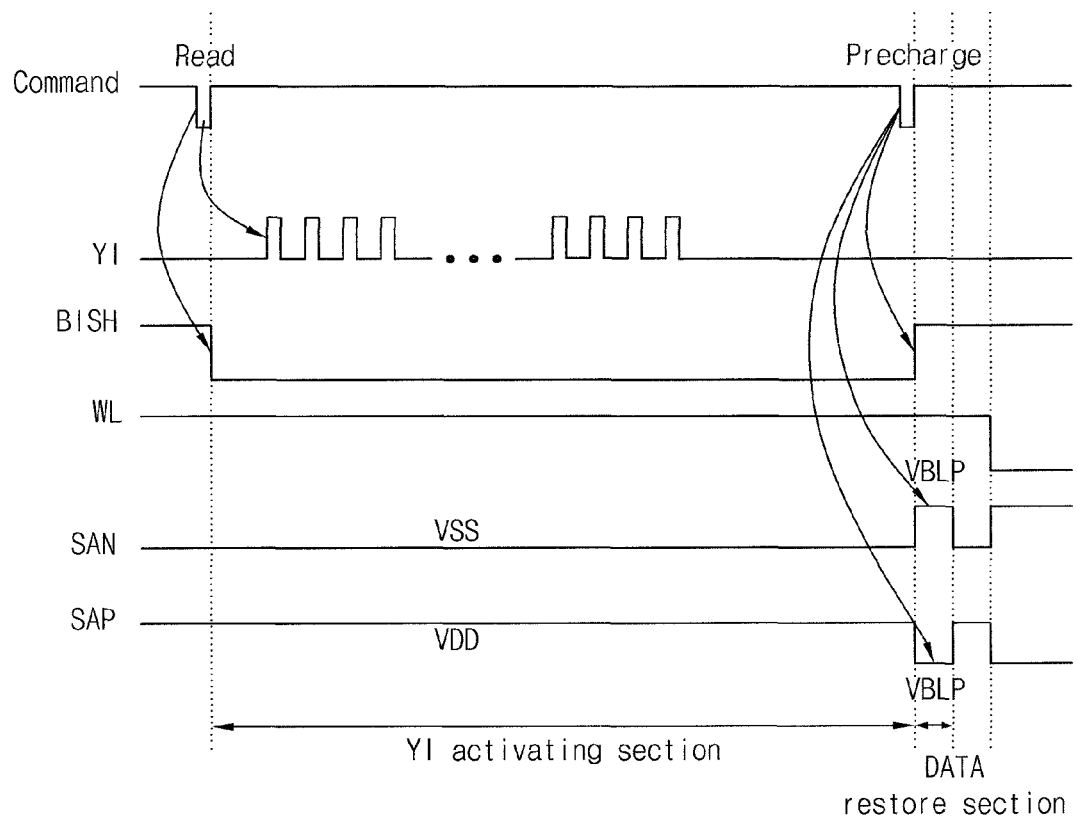
FIG. 5 is a timing diagram illustrating the operations for restoring data inverted due to a flip failure if a read command follows after a precharge command.

FIG. 5 shows an operational waveform of the present invention where the precharge command follows the read command.

If the read command is issued, the bit line select signal BISH for the activated cell array is transitioned from high to low. The bit lines BL, /BL and the sense amplifying circuit 24 are disconnected by the bit line select signal BISH.

If the column select signal YI is activated in this state, the sense amplifying circuit 24 and the data buses LDB, LDBB are connected regardless of the bit lines BL, /BL. Therefore, the data on the bit lines BL, /BL is preserved where the word line WL is activated.

As the size of semiconductor memory devices is reduced, the layout size of the sense amplifier is also reduced. Subsequently, the driving capability of the sense amplifier decreases and thus the sense amplifier has a flip failure resulting from the offset voltage. That is, the data is inverted.

The pull-up activating terminal RTO and the pull-down activating terminal SB of the sense amplifying circuit 24 are deactivated in order to restore the flip-failed data by applying the bit line precharge voltage VBLP in synchronization with the precharge command during the restore section. The signal on the bit lines BL, /BL is delivered to both output terminals of the sense amplifying circuit 24 by activating the bit line select signal BISH to a high level. Then, the data stored on the bit lines BL, /BL is delivered to the sense amplifying circuit 24 so that the data at the output terminals of the sense amplifying circuit 24 is updated to contain normal data regardless of the flip failure.

If the data at the output terminals of the sense amplifying circuit 24 is updated, the pull-up activating terminal RTO and the pull-down activating terminal SB of the sense amplifying circuit 24 transition to a high level and a low level respectively to amplify the updated data again.

The cell data is supplemented where the word line WL is activated since the bit lines BL, /BL are amplified to the ground voltage VSS and the power supply voltage VDD. If the cell data is supplemented, the word line WL is deactivated, and thereafter the precharge can be performed.

Figure 6:
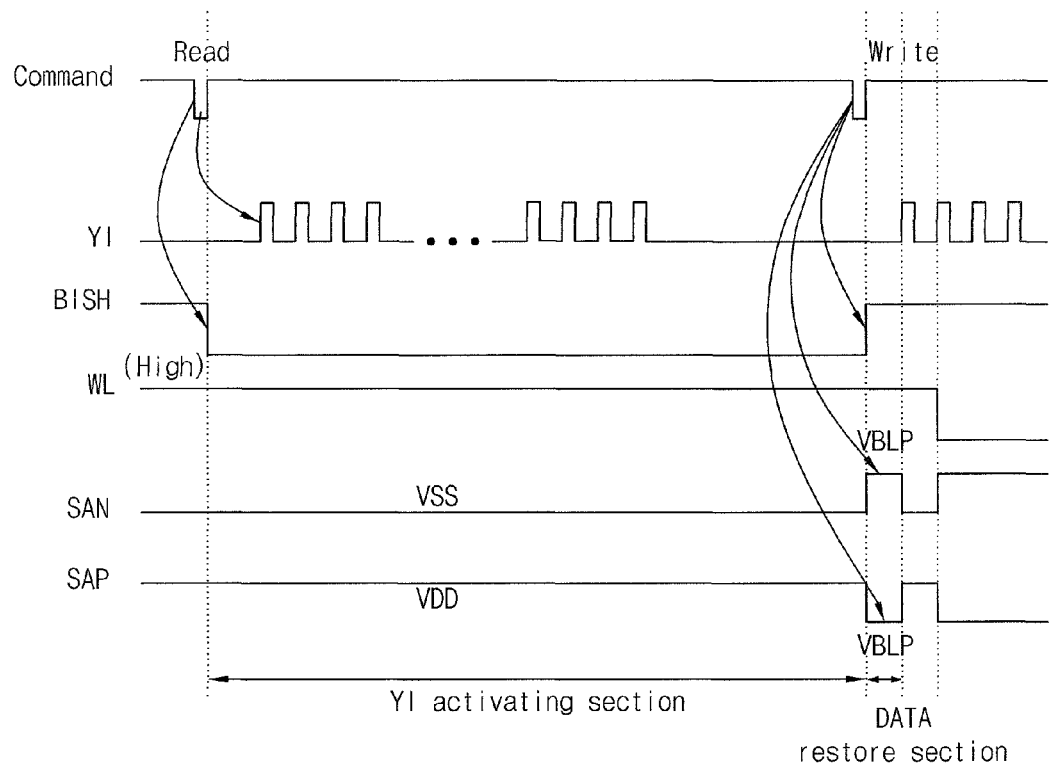
FIG. 6 is a timing diagram illustrating the operations for restoring data inverted due to a flip failure if a read command follows after a write command.

Meanwhile, FIG. 6 shows an operational waveform where a write command follows after a read command.

The operation of restoring the flip failure in FIG. 6 is the same as that in FIG. 5 except that the write operation can be performed where the word line WL is activated after the flip failure is restored.

Figure 7:
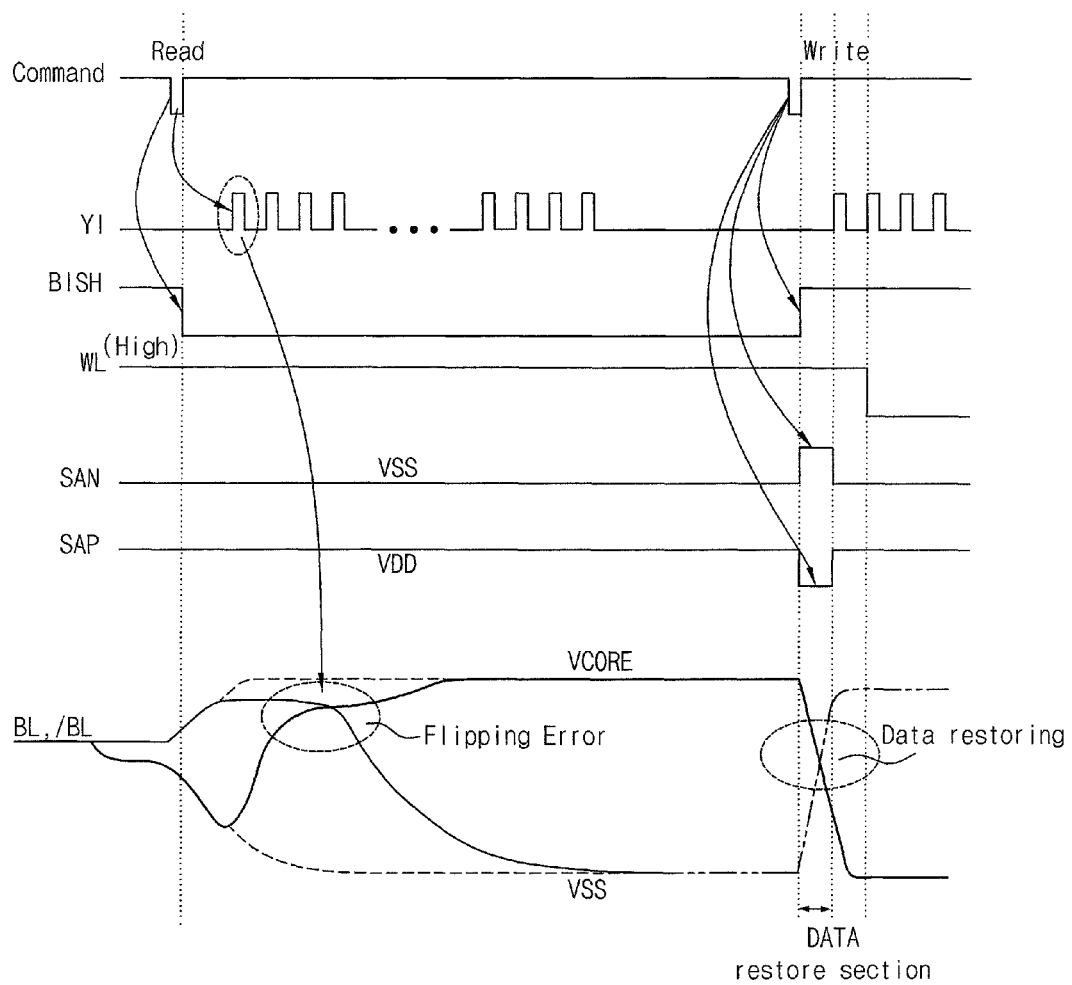
FIG. 7 is a waveform diagram illustrating a state in which a flip failure is restored in accordance with an embodiment of the present invention.

The data can be restored as in FIG. 7 by the operations explained in FIG. 5 and FIG. 6.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

The invention claimed is:

1. A driving method of a semiconductor memory device comprising:

disconnecting a bit line from a sense amplifying circuit according to a bit line select control signal after performing a read operation in response to a read command;

connecting the sense amplifying circuit to a data bus according to a column select control signal after the bit line is disconnected from the sense amplifying circuit;

deactivating an output terminal of the sense amplifying circuit that is disconnected from the bit line and is connected to the data bus, during a restore section in synchronization with a command following the read command; and delivering the data on the bit line to the output terminal of the sense amplifying circuit to update the output terminal of the sense amplifying circuit by connecting the sense amplifying circuit, having the deactivated output terminal, to the bit line according to the bit line select control signal.

2. The driving method of claim 1, wherein the command following the read command is a write command.

3. The driving method of claim 1, wherein the command following the read command is a precharge command.

* * * * *